(12) United States Patent
Victora et al.

(10) Patent No.: US 8,134,864 B2
(45) Date of Patent: Mar. 13, 2012

(54) EXCHANGE-ASSISTED SPIN TRANSFER TORQUE SWITCHING

(75) Inventors: Randall H. Victora, New Brighton, MN (US); Xi Chen, Minneapolis, MN (US)

(73) Assignee: Regents of the University of Minnesota, St. Paul, MN (US)

( * ) Notice: Subject to any disclaimer, the term of this patent is extended or adjusted under 35 U.S.C. 154(b) by 426 days.

(21) Appl. No.: 12/541,111

(22) Filed: Aug. 13, 2009

(65) Prior Publication Data

US 2010/0039855 A1 Feb. 18, 2010

Related U.S. Application Data

(60) Provisional application No. 61/088,971, filed on Aug. 14, 2008.

(51) Int. Cl.
*G11C 11/00* (2006.01)
(52) U.S. Cl. ............................ 365/158; 365/171; 365/173
(58) Field of Classification Search .................. 365/158, 365/171, 173
See application file for complete search history.

(56) References Cited

U.S. PATENT DOCUMENTS

| | | | |
|---|---|---|---|
| 7,126,848 B2 * | 10/2006 | Nakamura et al. | 365/171 |
| 7,313,015 B2 * | 12/2007 | Bessho | 365/158 |
| 7,372,727 B2 * | 5/2008 | Nakamura et al. | 365/171 |
| 7,483,291 B2 * | 1/2009 | Saito et al. | 365/158 |
| 2004/0166371 A1 | 8/2004 | Berger et al. | |
| 2005/0214586 A1 | 9/2005 | Do et al. | |
| 2006/0067115 A1 | 3/2006 | Gruber et al. | |
| 2006/0081953 A1 | 4/2006 | Nguyen et al. | |
| 2007/0159734 A1 | 7/2007 | Nguyen et al. | |
| 2007/0253243 A1 | 11/2007 | Fontana, Jr. et al. | |
| 2008/0100964 A1 | 5/2008 | Fullerton et al. | |

OTHER PUBLICATIONS

Meng et al., "Composite Free Layer for High Density Magnetic Random Access Memory with Lower Spin Transfer Current", Applied Physics Letters, vol. 89, No. 15, Oct. 12, 2006, 3pgs.
Guo et al., "Current-Induced Magnetization Switching in Pseudo-Spin-Valve Multilayers with and without a Ru Capping Layer", Physical Review, vol. B 72, No. 06, Aug. 19, 2005, 5pgs.
Jiang et al., "Effective Reduction of Critical Current for Current-Induced Magnetization Switching by a Ru Layer Insertion in an Exchange-Biased Spin Valve", Physical Review Letters, vol. 92, No. 16, Apr. 23, 2004, 4pgs.
Meng et al., "Spin Transfer Effect in Magnetic Tunnel Junction with a Nano-Current-Channel Layer in Free Layer", IEEE Transactions on Magnetics, vol. 41, No. 10, Oct. 2005, 3pgs.
Huai et al. "Structure, Materials and Shape Optimization of Magnetic Tunnel Junction Devices: Spin -Transfer Switching Current Reduction for Future Magnetoresistive Random Access Memory Application", Japanese Journal of Applied Physics, vol. 45, No. 5A, May 9, 2006, 7pgs.

* cited by examiner

*Primary Examiner* — Son Dinh
(74) *Attorney, Agent, or Firm* — Shumaker & Sieffert, P.A.

(57) ABSTRACT

In general, the invention is directed to techniques for reducing the amount of switching current that is utilized within a magnetic storage (e.g., MRAM) device. An example apparatus includes a fixed magnetic layer that provides a fixed direction of magnetization, an exchange-coupled magnetic multi-layer structure, and a non-magnetic layer placed between the fixed magnetic layer and the exchange-coupled magnetic multi-layer structure. The exchange-coupled magnetic multi-layer structure includes a recording layer configured to record information and an assisting layer having a lower anisotropy than the recording layer. The exchange coupling between the recording and assisting layers is operable to switch a magnetization direction of the recording layer. In some cases, the exchange-coupled magnetic multi-layer structure may further include a spacer separating the recording and assisting layers and configured to weaken an exchange coupling between the recording and assisting layers.

44 Claims, 10 Drawing Sheets

EXCHANGE-ASSISTED SPIN TRANSFER TORQUE SWITCHING

RELATED APPLICATION

This application claims the benefit of U.S. Provisional Application No. 61/088,971, filed on Aug. 14, 2008 and entitled "EXCHANGE-ASSISTED SPIN TRANSFER TORQUE SWITCHING," the entire content of which is incorporated herein by reference.

STATEMENT REGARDING FEDERALLY SPONSORED RESEARCH OR DEVELOPMENT

The United States Government may have certain rights in this application, which was made, at least in part, with United States Government support under Contract DMR-0212302 with the National Science Foundation, and also under Contract ECS-0621868 with the National Science Foundation.

TECHNICAL FIELD

This disclosure relates to memory devices and, more particularly, to memory devices that implement spin transfer torque switching.

BACKGROUND

Magnetoresistive memory devices, such as Magnetoresistive Random Access Memory (MRAM), use magnetization to store information. MRAM is a non-volatile memory device that uses magnetization to store information. Proposed in the early 1990s, MRAM is a relatively new technology compared to other forms of memory, such as dynamic random access memory (DRAM), electrically erasable programmable read-only memory (EEPROM), flash memory, etc. One major advantage of MRAM over its competitors mentioned above is its ability to combine various appealing attributes (e.g., non-volatility, speed) into one single memory solution.

In order to write information into an MRAM cell, a way to switch the magnetization within the cell is needed. In the current generation of MRAM, magnetic bits are written with the magnetic field produced by an electrical current. The spatial extended Orsted field may limit the recording density and the power consumption. An alternative method to manipulate the magnetization is to use a spin polarized current through the spin transfer torque (STT) effect. The STT effect originates from the exchange interaction between the transported electron and local magnetic moments. Magnetization switching has been realized in experiment. One difficulty for wide application of the current-induced switching is the high critical current density (on the order $10^7$ A/cm$^2$) that may be required to reverse, or switch, the magnetization. High switching current increases the overall power assumption. More significantly, it may prevent the reduction in size of the device when transistors providing large currents are needed.

SUMMARY

In general, the invention is directed to techniques for reducing the amount of switching current that is utilized within a magnetic storage (e.g., MRAM) device. Instead of using a single magnetic hard layer as the recording layer within a MRAM cell of the device, a composite structure that includes an exchange-coupled assisting layer and a recording layer is used. The recording layer may be made of a material with high uniaxial anisotropy. The assisting layer may include at least one magnetic layer with lower anisotropy than the recording layer. In some example cases, the assisting layer may have a lower damping constant with respect to the recording layer. In general, lower switching currents can be achieved by including multiple assisting sub-layers with the ensemble exhibiting an anisotropy gradient. Adjacent layers may be exchange-coupled with each other.

Various benefits and advantages may be realized. For example, one potential advantage may be significantly decreasing the switching current with no loss of thermal stability. This may be achieved by optimizing the strength of exchange-coupling, the damping constants, and/or the anisotropies in the one or more soft assisting layers/sub-layers. For example, when the assisting layer includes four exchange-coupled sub-layers with gradually increasing anisotropy, the switching current may potentially be lowered (e.g., by a factor of thirty), which may result in increased recording density and/or reduced power assumption within MRAM cells.

In one embodiment, an apparatus comprises a fixed magnetic layer that provides a fixed direction of magnetization, an exchange-coupled magnetic multi-layer structure, and a non-magnetic layer placed between the fixed magnetic layer and the exchange-coupled magnetic multi-layer structure. The exchange-coupled magnetic multi-layer structure comprises a recording layer configured to record information and an assisting layer having a lower anisotropy than the recording layer. The exchange coupling between the recording and assisting layers is operable to switch a magnetization direction of the recording layer.

In one embodiment, a magnetic memory device comprises a plurality of bit lines, a plurality of word lines, and a plurality of memory cells that are each coupled to one of the bit lines and one of the word lines. At least one memory cell comprises a fixed magnetic layer that provides a fixed direction of magnetization, an exchange-coupled magnetic multi-layer structure, and a non-magnetic layer placed between the fixed magnetic layer and the exchange-coupled magnetic multi-layer structure. The exchange-coupled magnetic multi-layer structure comprises a recording layer configured to record information and an assisting layer having a lower anisotropy than the recording layer. The exchange coupling between the recording and assisting layers is operable to switch a magnetization direction of the recording layer.

In one embodiment, a method comprises forming a fixed magnetic layer that provides a fixed direction of magnetization, forming an exchange-coupled magnetic multi-layer structure, and forming a non-magnetic layer placed between the fixed magnetic layer and the exchange-coupled magnetic multi-layer structure. Forming the exchange-coupled magnetic multi-layer structure comprises forming a recording layer configured to record information and forming an assisting layer having a lower anisotropy than the recording layer. The exchange coupling between the recording and assisting layers is operable to switch a magnetization direction of the recording layer.

The details of one or more embodiments of the invention are set forth in the accompanying drawings and the description below. Other features, objects, and advantages will be apparent from the description and drawings, and from the claims.

DETAILED DESCRIPTION

Figure 1:
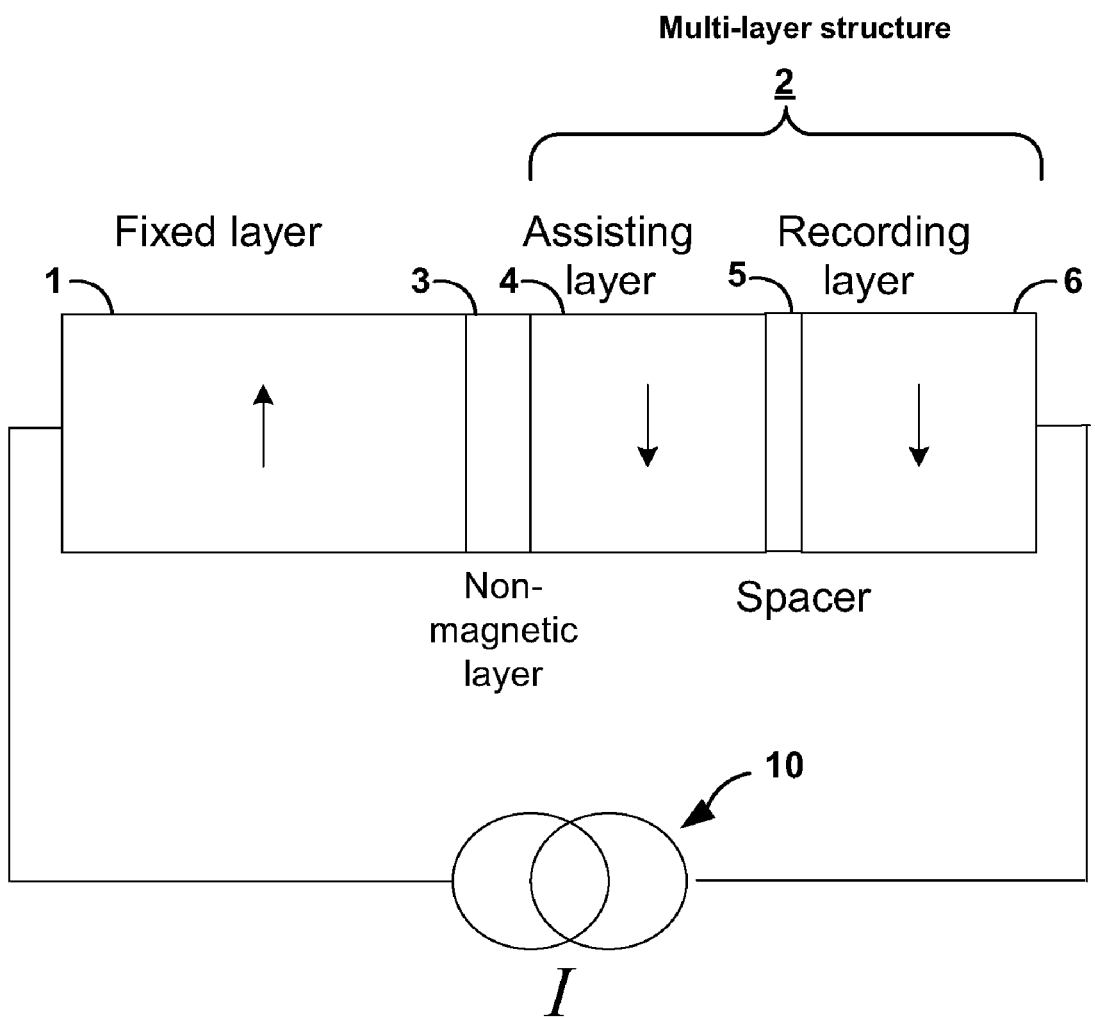
FIG. 1 is a conceptual diagram illustrating an example spin transfer torque (STT) switching cell, according to one embodiment.

FIG. 1 is a conceptual diagram illustrating an example spin transfer torque (STT) switching cell, according to one embodiment. This STT cell may comprise a Magnetoresistive Random Access Memory (MRAM) memory cell within an MRAM device. The cell shown in FIG. 1 includes a direct current (DC) current generator 10, a magnetically fixed layer 1, a non-magnetic layer 3 (which may, in some cases, comprise a tunnel barrier), an assisting layer 4, a spacer 5, and a magnetically hard recording layer 6. The current may change direction according to the information being transmitted. The direction of magnetization in fixed layer 1 may be fixed, such as, for example, by an exchange bias effect. Non-magnetic layer 3 may comprise a tunnel barrier, which may be made of a metal oxide, such as $Al_2O_3$, MgO. Recording layer 6 is configured to record information, and may be made of ferromagnetic materials, and, in some cases, may be made of ferromagnetic materials with high anisotropy to assure thermal stability as the device shrinks in size.

Assisting layer 4 may be made of a material having a lower anisotropy than the material of recording layer 6. In addition, in some cases, assisting layer 4 may be made of a material that has a lower damping constant that the material of recording layer 6. In some cases, assisting layer 4 may comprise permalloy or iron silicon. Assisting layer 4, spacer 5, and recording layer 6 may comprise an exchange-coupled magnetic multi-layer structure 2. Non-magnetic layer 3 may be placed between fixed layer 1 and multi-layer structure 2.

The arrows shown within the fixed layer 1, assisting layer 4, and recording layer 6 are exemplary only, and indicate example directions of magnetization within these layers at any given time. Changes in magnetization may be initiated in the assisting layer 4 that, in turn, drives a switch in the direction of magnetization of recording layer 6. The direction of magnetization within fixed layer 1 may remain constant, while the magnetization direction within assisting layer 4 and recording layer 6 may be changed, or switched, over the course of time based upon exchange coupling between assisting layer 4 and recording layer 6. Although not shown in FIG. 1, fixed layer 1 is coupled to a first electrical contact, and recording layer 6 is coupled to a second electrical contact. These electrical contacts couple these layers to current source 10.

Figure 3:
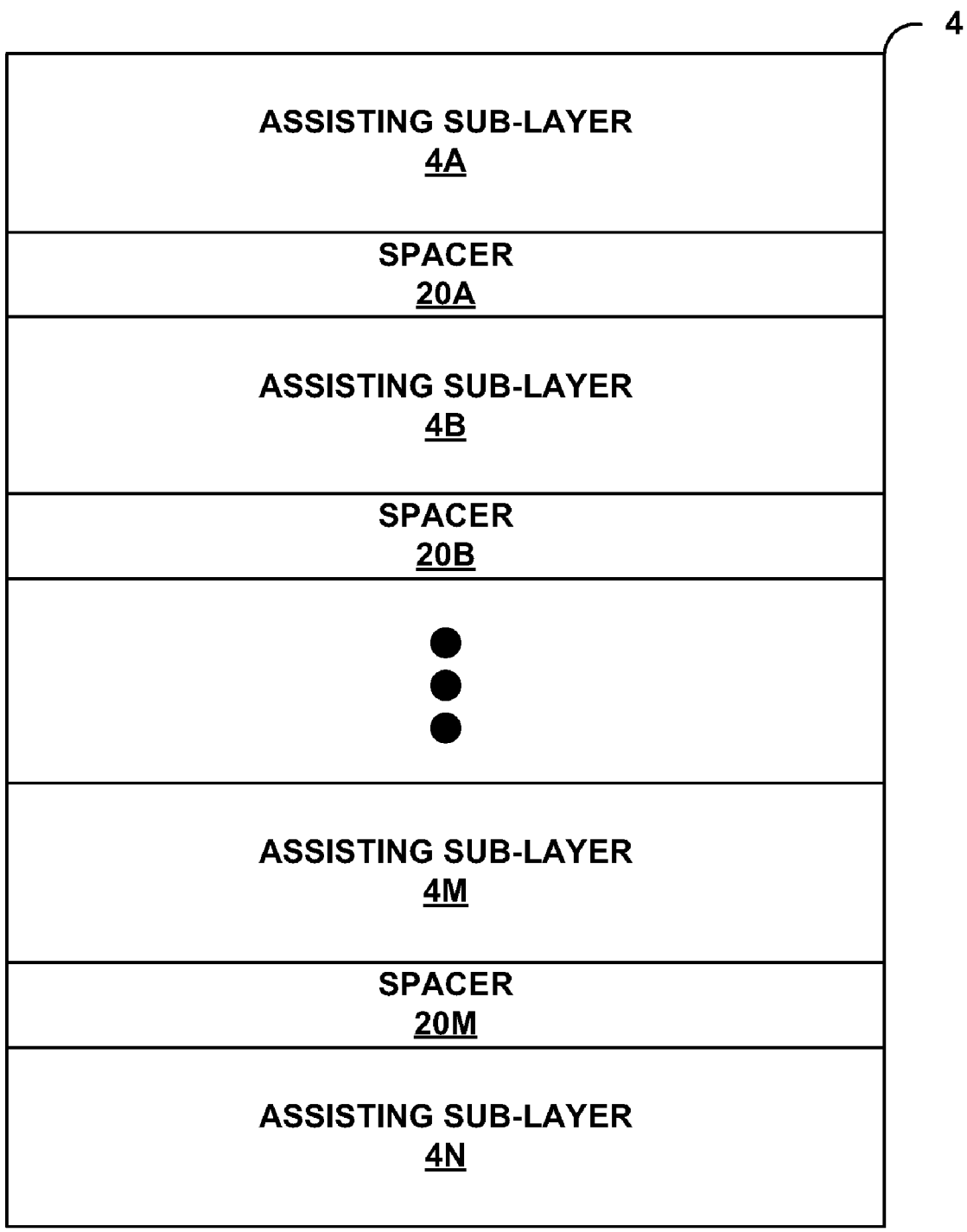
FIG. 3 is a conceptual diagram illustrating a sectional view of one or more sub-layers within an assisting layer of a memory cell, according to one embodiment.

In some cases, assisting layer 4 may contain multiple sub-layers, even though only one is shown in FIG. 1. (Exemplary sub-layers are shown in FIG. 3) The exchange-coupling strength between assisting layer 4 and recording layer 6 can be tuned by adjusting the thickness or material of spacer 5 that separates these two layers, in some cases. Spacer 5 is directly coupled to both assisting layer 4 and recording layer 6. Spacer 5 is directly coupled on one side, or surface, to assisting layer 4, and is directly coupled on its opposite side, or surface, to recording layer 6. As a result, assisting layer 4 and recording layer 6 may be exchange coupled via spacer 5. In some cases, spacer 5 may be made of a paramagnetic material, such as palladium or platinum. In some cases, spacer 5 may serve to weaken the exchange coupling between assisting layer 4 and recording layer 6. As a result, in these cases, the exchange coupling between assisting layer 4 and recording layer 6 may be tuned (e.g., increased or decreased) by altering the thickness and/or material of spacer 5.

In some cases, the energy E associated with exchange coupling is given by $E=-Jm_h \cdot m_i*V$, where $m_h$ and $m_i$ are the magnetic moments normalized to a value of one for layers h and i, V is the volume of layer h or layer i that is most distant from the fixed layer, and J is a constant. (Layers h and i may comprise any pair of layers, such as, for example, any pair of the layers shown in FIGS. 1 and 2.) The exchange energy E and the damping constant α can be measured by ferromagnetic resonance. The basics of this technique are described in Chapter 16 of Physics of Magnetism by S. Chikazumi and S. H. Charap (Wiley, 1964).

Figure 2:
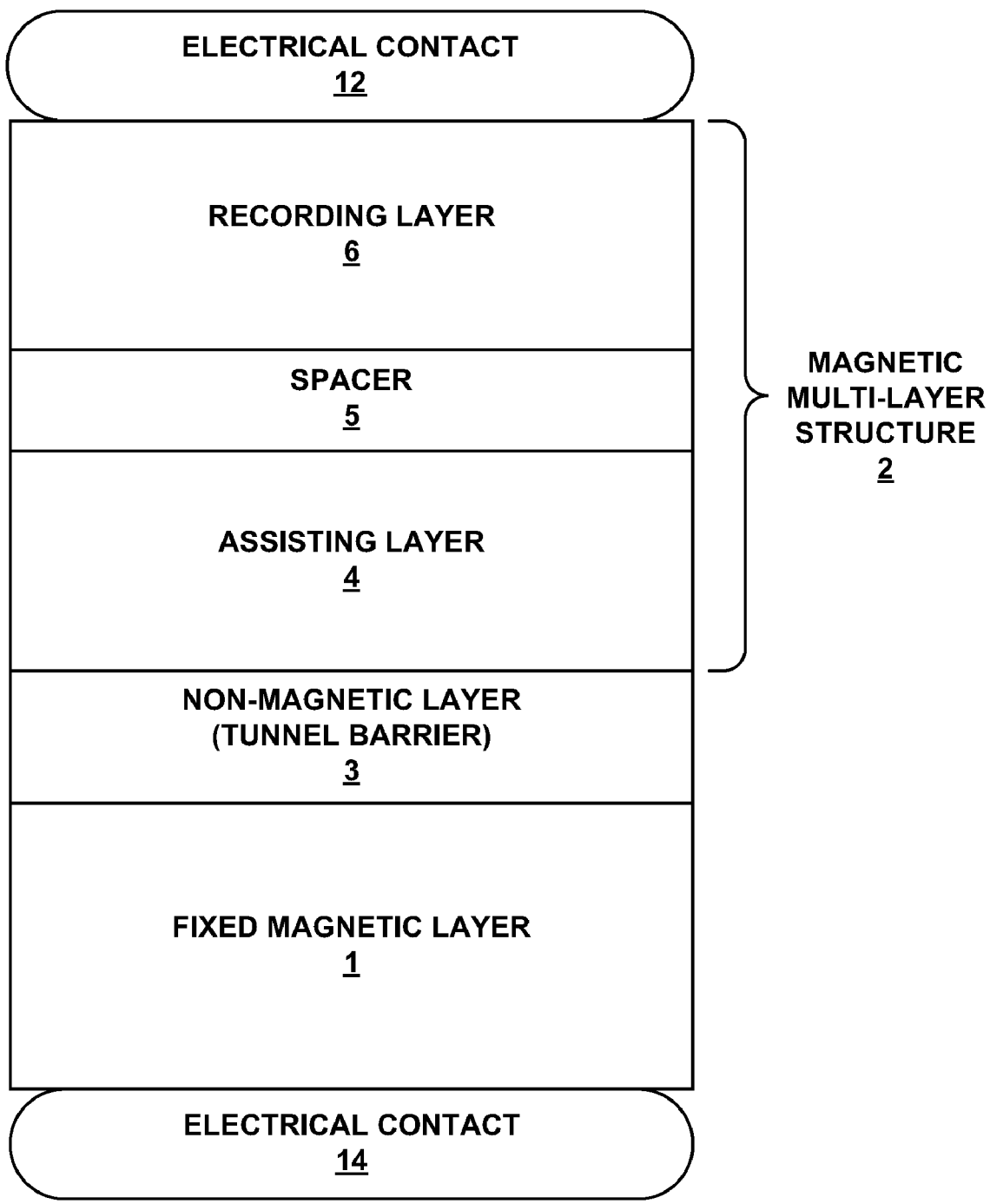
FIG. 2 is a conceptual diagram illustrating a sectional view of the cell shown in FIG. 1, according to one embodiment.

FIG. 2 is a conceptual diagram illustrating a sectional view of the cell shown in FIG. 1, according to one embodiment. As is shown in the example of FIG. 2, fixed (magnetic) layer 1 is coupled on one side, or surface, to an electrical contact 14, and is coupled on an opposite side, or surface, to non-magnetic layer 3 (e.g., tunnel barrier). Non-magnetic layer 3 is placed between fixed magnetic layer 1 and assisting layer 4. Assisting layer 4, which may comprise one or more sub-layers of varying anisotropy, is placed between non-magnetic layer 3 and spacer 5. Spacer 5 is placed between assisting layer 4 and recording layer 6. Recording layer 6 is directly coupled to electrical contact 12. Electrical contacts 12 and 14 are each coupled to current source 10. And, as described in reference to FIG. 1, assisting layer 4, spacer 5, and recording layer 6 may comprise a magnetic multi-layer structure 2.

In some cases, the cell shown in FIG. 2 may be formed, or manufactured, in a bottom-up fashion. In these cases, non-magnetic layer 3 may be formed on top of fixed layer 1. Assisting layer 4 may be formed on top of non-magnetic layer 3, and spacer 5 may be formed on top of assisting layer 4. Recording layer 6 may be formed on spacer 5. In other cases, the cell may be formed in the opposite fashion. In these cases, recording layer 6 may serve as the bottom layer. Spacer 5 may be formed on recording layer 6, assisting layer 4 may be formed on spacer 5, non-magnetic layer 3 may be formed on assisting layer 4, and fixed layer 1 may be formed on non-magnetic layer 3. As described above, in some cases, non-magnetic layer 3 may comprise a tunnel barrier.

FIG. 3 is a conceptual diagram illustrating a sectional view of one or more sub-layers within assisting layer 4, according to one embodiment. In this embodiment, assisting layer 4 includes one or more assisting sub-layers 4A-4N. It is assumed, in this embodiment, that sub-layer 4A is directly coupled to spacer 5, and that sub-layer 4N is directly coupled to non-magnetic layer 3. In the example of FIG. 3, assisting sub-layers 4A-4N may be separated by spacers, which may, in some cases, have similar structural properties to spacer 5. These are shown as spacers 20A-20M in FIG. 3. For example, spacer 20A is placed between assisting sub-layers 4A and 4B, and spacer 20M is placed between assisting sub-layers 4M and 4N. Each spacer 20A-20M may be configured to weaken an exchange coupling between individual assisting sub-layers.

Sub-layers 4A-4N may be made of materials having different anisotropies. In some cases, sub-layers 4A-4N have monotonically increasing anisotropies as they approach recording layer 6. In these cases, sub-layer 4N may be made of a material having the lowest anisotropy of any of sub-layers 4A-4N. Sub-layer 4B, shown in FIG. 3, may have a higher anisotropy than sub-layer 4N, but may have a lower anisotropy than sub-layer 4A. Sub-layer 4A may have the highest anisotropy of any of sub-layers 4A-4N, but would have a lower anisotropy than recording layer 6.

In general, there may be no restriction on the damping constants for sub-layers 4A-4N with respect to recording layer 6. In some cases, however, at least one of sub-layers 4A-4N is made of a material having a lower damping constant than the material of recording layer 6. In some cases, sub-layers 4A-4N may have damping constants each lower than the damping constant of recording layer 6. The damping constant could be measured by ferromagnetic resonance. In some cases, one or more of sub-layers 4A-4N that are near, or closest, to fixed layer 1 may have a low damping constant with respect to recording layer 6.

Figure 4:
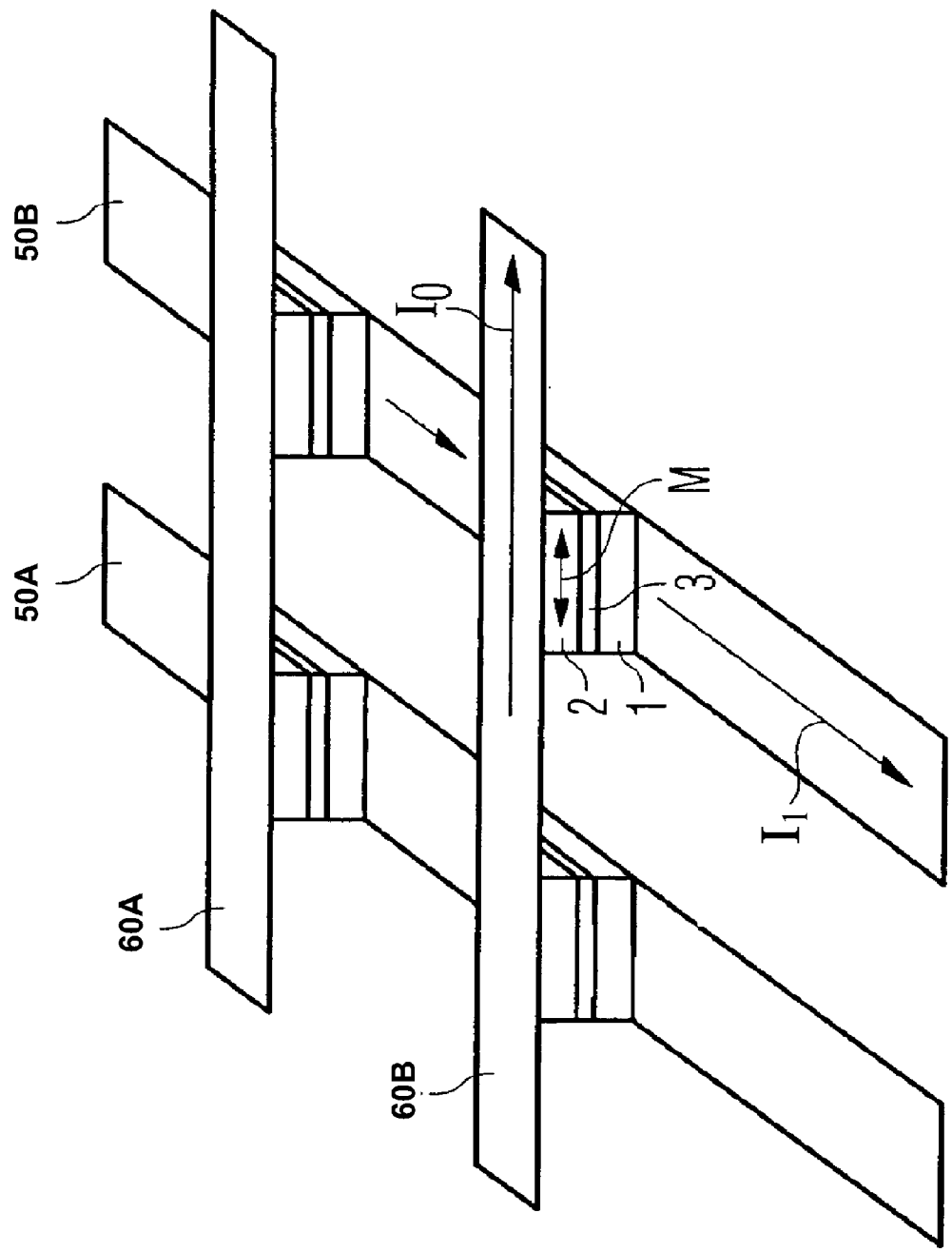
FIG. 4 is a perspective diagram illustrating multiple cells, such as the cell shown in FIG. 1, within a memory device, according to one embodiment.

FIG. 4 is a perspective diagram illustrating multiple MRAM cells, such as the cell shown in FIG. 1, within an MRAM memory device, according to one embodiment. FIG. 4 shows multiple cells, each having a fixed layer 1, a non-magnetic layer 3, and a multi-layer structure 2 (which includes an assisting layer 4, a spacer 5, and a recording layer 6). One such cell is labeled within FIG. 4. FIG. 4 also shows multiple word lines 60A, 60B and multiple bit lines 50A, 50B. In some cases, bit lines 50A and 50B are orthogonal to word lines 60A and 60B.

Each MRAM memory cell is in contact with word line 60A or 60B via its multi-layer structure 2, and is in contact with bit line 50A or 50B via its fixed layer 1. For example, each MRAM memory cell may include a first electrical contact (e.g., electrical contact 14 shown in FIG. 2) that is configured to couple its fixed layer 1 to one of bit lines 50A or 50B. Each MRAM memory cell may further include a second electrical contact (e.g., electrical contact 12 shown in FIG. 2) configured to couple its recording layer 6 within multi-layer structure 2 to one of word lines 60A or 60B.

In some cases, during a write process, an electrical (write) current $I_0$ or $I_1$ flows through thin layer circuit paths of word line 60B and bit line 50B, for example, in the direction of the arrows shown in FIG. 4. By different directions of magnetization or polarization, respectively, of the multi-layer structure 2 of each cell, different states of information may be distinguished and stored in the cell. The direction of magnetization of the recording layer 6 within the multi-layer structure 2 of a given cell may be dynamically switched in multiple directions, as is indicated by the double arrow shown in FIG. 4. After the switching off of the currents $I_0$ and $I_1$, the magnetic state of the MRAM memory cell remains stored, and, depending on the direction of magnetization, a differentiation may be made between a logic "1" and a logic "0".

For reading out the information stored in an MRAM memory cell, the differing electric resistance of the MRAM memory cell is detected, by means of a current that may flow through word line 60A or 60B and bit line 50A or 50B, to determine the state of magnetization of the recording layer 6 of the cell. In the case of an anti-parallel orientation of the magnetization between the recording layer 6 of multi-layer structure 2 and the fixed layer 1, the MRAM memory cell may have a high electric resistance that may be assigned to a logic value of "0," for example. In the case of a parallel orientation of the magnetization between the recording layer 6 of multi-layer structure 2 and the fixed layer 1, the MRAM memory cell may have a lower electric resistance that may be assigned to a logic value of "1."

To predict the dynamic behavior of the MRAM cell shown in FIG. 1, the Landau-Liftshitz-Gilbert (LLG) may be employed with an additional spin transfer torque, which takes the form:

$$T|_{STT} = \gamma M_s H_{STT} \hat{m} \times (\hat{p} \times \hat{m})$$

where $\hat{p}$ is the current polarization direction, $H_{STT}$ is the effective field induced by a spin current, $\hat{m}$ is the unit vector pointing along the magnetization direction, $M_S$ is the saturation magnetization, and $\gamma$ is the gyromagnetic ratio. In particular $$H_{STT} = \frac{jP\hbar}{eM_s d},$$

wherein j is the current density, e is the charge of an electron, $\hbar$ is Planck's constant, P is the polarization factor, and d is the layer thickness of layer that spin torque is acting upon. The direct switching current that may be required without the use of assisting layer 4 may take the form $$j_{c0} = \frac{\alpha_H e d}{P\hbar} K_H$$

where $K_H$ is the anisotropy of the hard recording layer 6, e is the charge of an electron, $\hbar$ is Planck's constant, and $\alpha_H$ is the damping constant of recording layer 6. For purposes of illustration only in the examples described below, it may be assumed that the hard recording layer 6 is characterized by the parameters $K_H = 10^7$ erg/cm$^3$, d=2 nm, $\alpha_H = 0.1$, while the polarization factor P=0.5. Therefore, in this example, the direct switching current density, without the use of assisting layer 4 shown in FIG. 1, is $j_{co} \approx 5.4 \times 10^7$ A/cm$^2$. This switching current density can be reduced through implementation of the assisting layer 4, which may comprise one or more assisting sub-layers of differing anisotropy.

Figure 5:
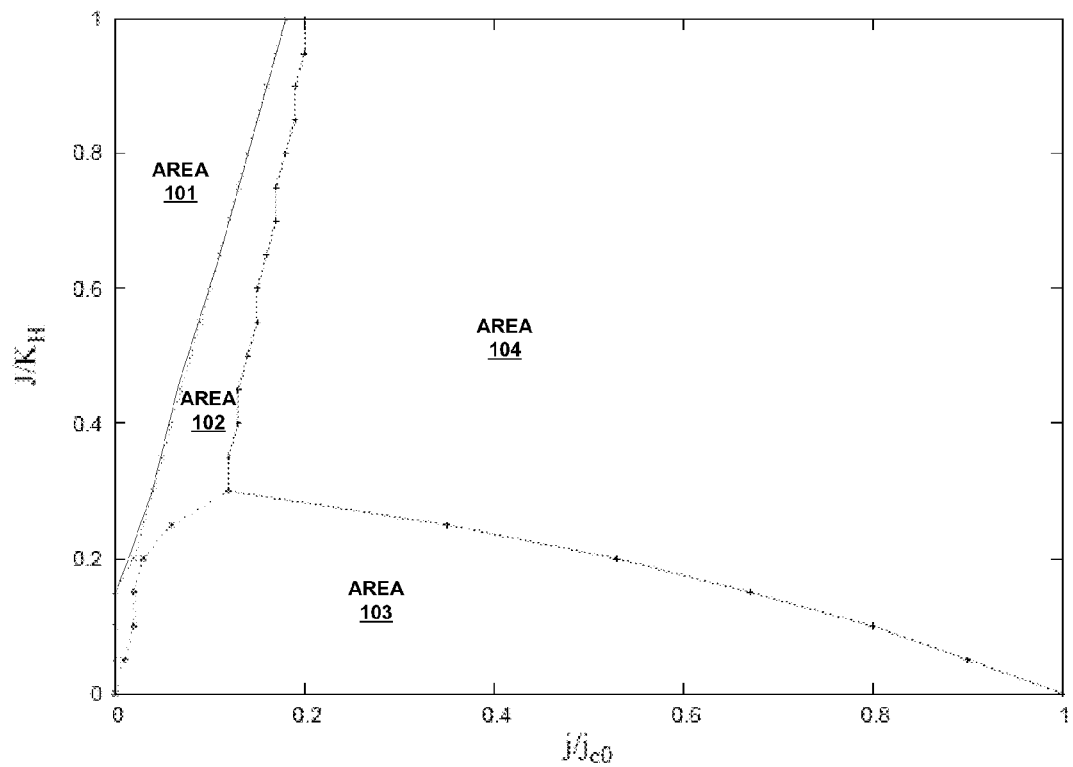
FIG. 5 is a graph diagram illustrating the dynamic phase diagram of the multi-layer structure shown in FIG. 1, according to one embodiment.

FIG. 5 is a graph diagram that illustrates the dynamic phase diagram of multi-layer structure 2, shown in FIG. 1, which includes hard recording layer 6 and soft assisting layer 4, according to one embodiment. In one embodiment, recording layer 6 comprises a hard ferromagnetic material, while assisting layer 4 comprises one or more softer ferromagnetic materials. In the example of FIG. 5, assisting layer 4 has an anisotropy $$K_1 = \frac{K_H}{10}$$

and a damping constant $\alpha = 0.005$. Thus, in this particular example, the anisotropy and damping constant of the assisting layer 4 is lower than the corresponding anisotropy and damping constant of recording layer 6. (In this example, the damping constant of recording layer 6 is $\alpha_H = 0.1$.)

In FIG. 5, the exchange-coupling J and current density j is normalized by the anisotropy $K_H$ of recording layer 6 and the direct switching current $j_{co}$ (calculated without the use of assisting layer 4), respectively. The memory cell utilizing the assisting layer 4 may exhibit four distinct behaviors, in some cases. In region, or area, 101 shown in FIG. 5, neither assisting layer 4 nor recording layer 6 is switched (with respect to their directions of magnetization). In area 102, both layers 4 and 6 are found in a steady precession state. In area 103, assisting layer 4 is switched while recording layer 6 is not, which may occur when exchange-coupling between assisting layer 4 and recording layer 6 is weak. In area 104, both assisting layer 4 and recording layer 6 are switched. As may be seen from FIG. 5, the switching current density j (obtained through utilization of assisting layer 4) can be reduced compared to $j_{co}$, and there may exist an optimal exchange-coupling J that minimizes j.

As described previously, assisting layer 4 can be made of multiple sub-layers with gradually increasing anisotropy. For example, FIG. 3 shows examples of such assisting sub-layers 4A-4N. These assisting sub-layers 4A-4N may be separated from each other by spacers, such as spacers 20A-20M.

Figure 6:
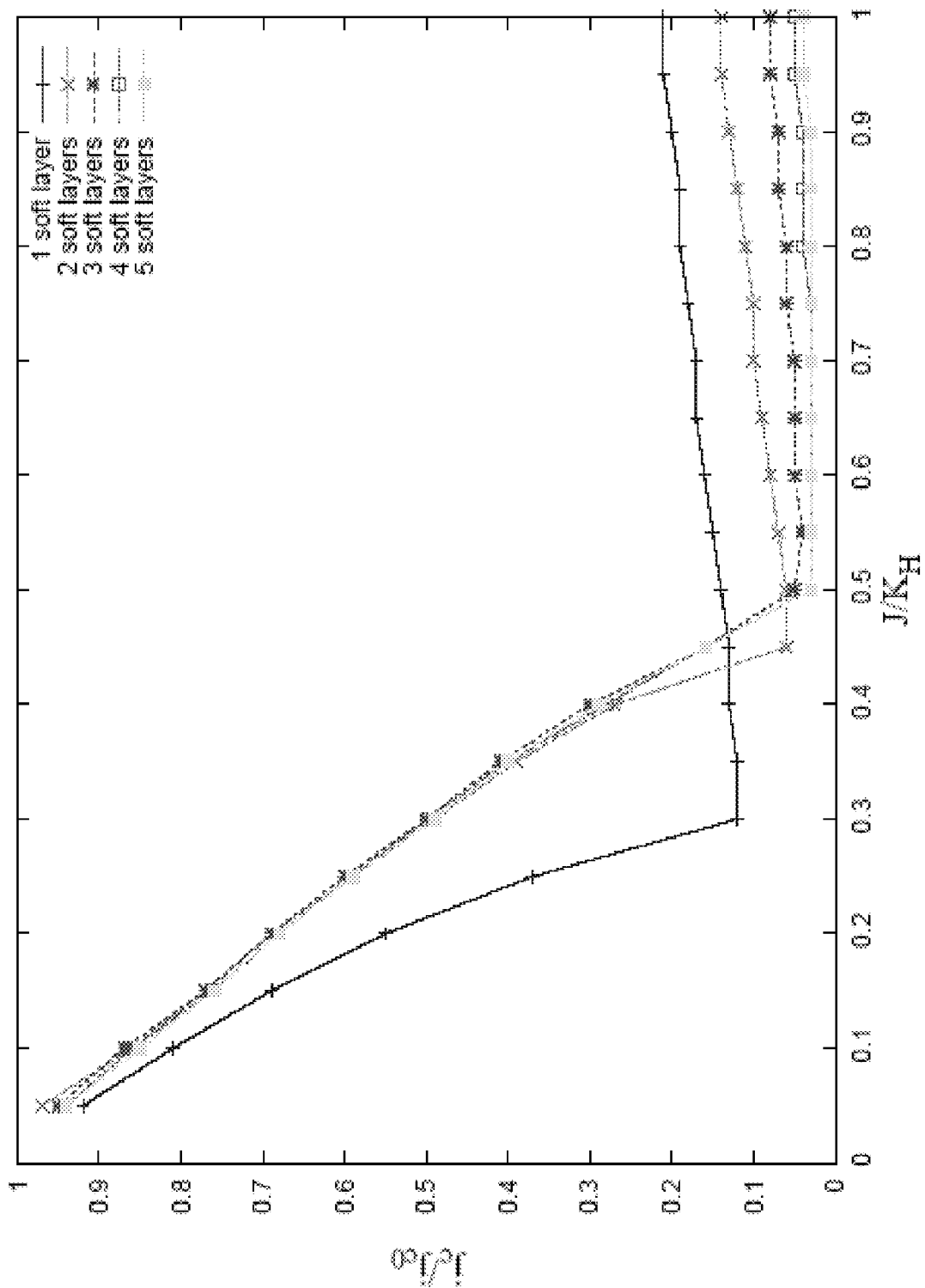
FIG. 6 is a graph diagram illustrating the switching current as a function of exchange-coupling when the number of soft sub-layers within an assisting layer ranges from one layer to five layers, according to one embodiment.

FIG. 6 is a graph diagram illustrating the switching current as a function of exchange-coupling when the number of soft sub-layers within assisting layer 4 ranges from one soft (sub) layer to five soft (sub)layers, according to one embodiment. In the example of FIG. 6, the damping constant in all soft sub-layers of assisting layer 4 is taken to be 0.005 (although, in other example cases, the damping constants of the soft sub-layers may vary, and may be less than the damping constant of recording layer 6). In general, there may be no restriction on the damping constants for the sub-layers of assisting layer 4 with respect to recording layer 6.

In some cases, as shown in FIG. 6, an optimal exchange-coupling between assisting layer 4 and recording layer 6 appears around $$J = \frac{K_H}{2}.$$

When more than one soft sub-layer is included within assisting layer 4, the anisotropies of these sub-layers may gradually, or monotonically, increase from sub-layer to sub-layer (as the sub-layers approach, or become more proximal to, recording layer 6), as is shown in Table 1. These anisotropies may, in some cases, be chosen so that the switching current is minimized. (In Table 1, when multiple sub-layers are included within assisting layer 4, it is assumed that sub-layer "1," having an anisotropy $K_1$ (as compared to the anisotropy $K_H$ of recording layer 6) is located proximal to non-magnetic layer 3, and that each subsequent sub-layer is located more proximally to recording layer 6. The values included within the tables are anisotropy ratios.) As shown in FIG. 6, the current density can be reduced significantly, up to a factor of thirty in some cases.

TABLE 1

| Number of soft sub-layers | $\frac{K_1}{K_H}$ | $\frac{K_2}{K_H}$ | $\frac{K_3}{K_H}$ | $\frac{K_4}{K_H}$ | $\frac{K_5}{K_H}$ |
|---|---|---|---|---|---|
| 1 | 0.1 | | | | |
| 2 | 0.2 | 0.6 | | | |
| 3 | 0.2 | 0.5 | 0.6 | | |
| 4 | 0.1 | 0.3 | 0.5 | 0.6 | |
| 5 | 0.1 | 0.2 | 0.4 | 0.5 | 0.6 |

Figure 7:
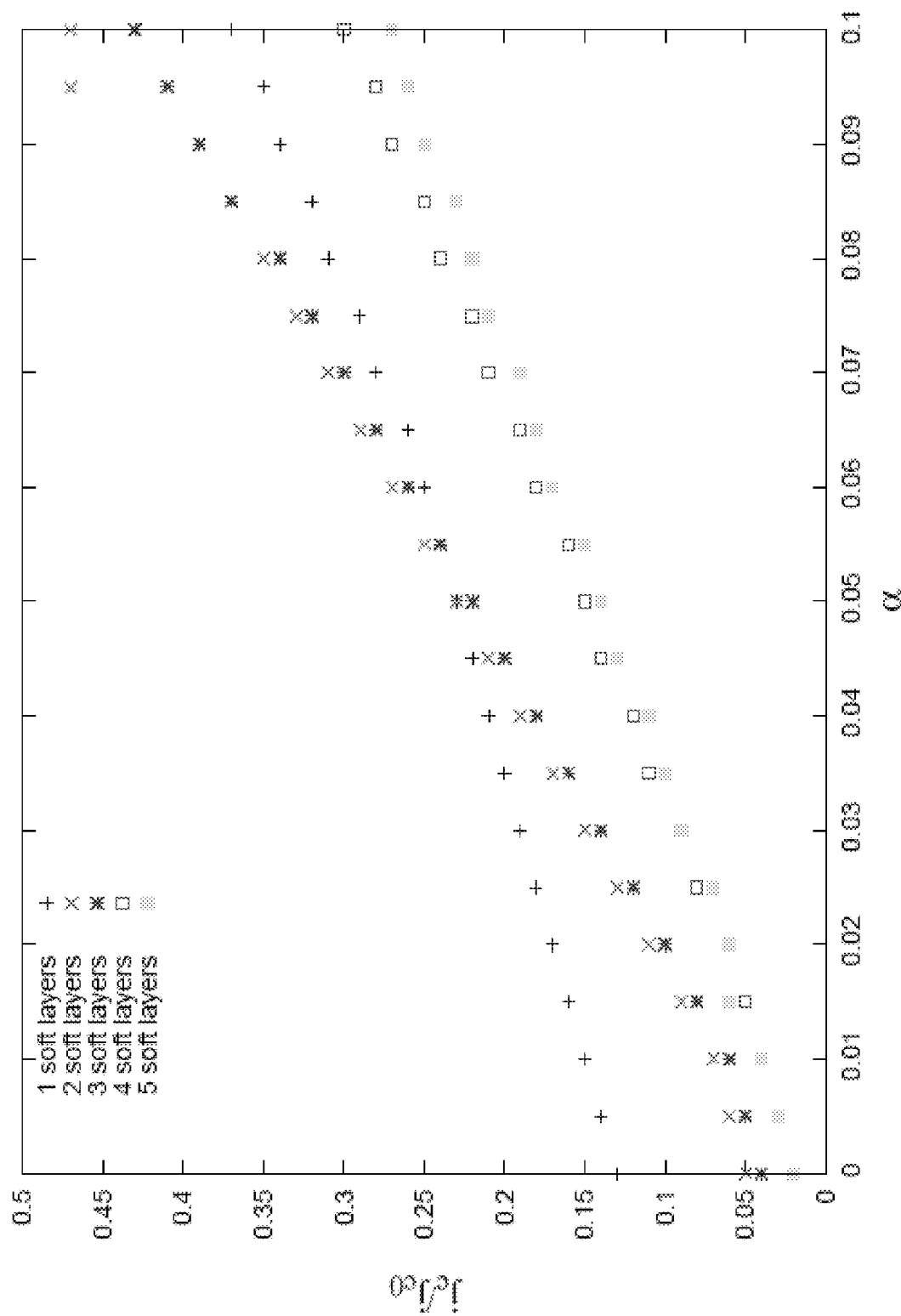
FIG. 7 is a graph diagram illustrating switching current values plotted against damping constant values, according to one embodiment.

FIG. 7 is a graph diagram illustrating switching current values plotted against damping constant values, according to one embodiment. In FIG. 7, the switching current $j_c$, normalized by $j_{co}$ (which is the switching current when no assisting layer 4 is used), is plotted against the damping constant $\alpha$ in the soft sub-layers of assisting layer 4, when the number of sub-layers may range from one to five. In each case, the switching current $j_c$ increases linearly with $\alpha$. Thus, as can be seen from FIG. 7, it may, in some cases, be advantageous to utilize small values of the damping constant $\alpha$ within the individual sub-layers of assisting layer 4, at least in comparison to the damping constant of recording layer 6. In some cases, each sub-layer may have the same damping constant. In other cases, sub-layers within assisting layer 4 may have different damping constants, but at least one that is lower than the damping constant of recording layer 6. In some cases, one or more of the sub-layers that are near, or closest, to fixed layer 1 may have a low damping constant with respect to recording layer 6. (FIG. 7 is shown for exemplary purposes only. In general, there may be no restriction on the values of the damping constants for the sub-layers of assisting layer 4 with respect to recording layer 6.)

Figure 8:
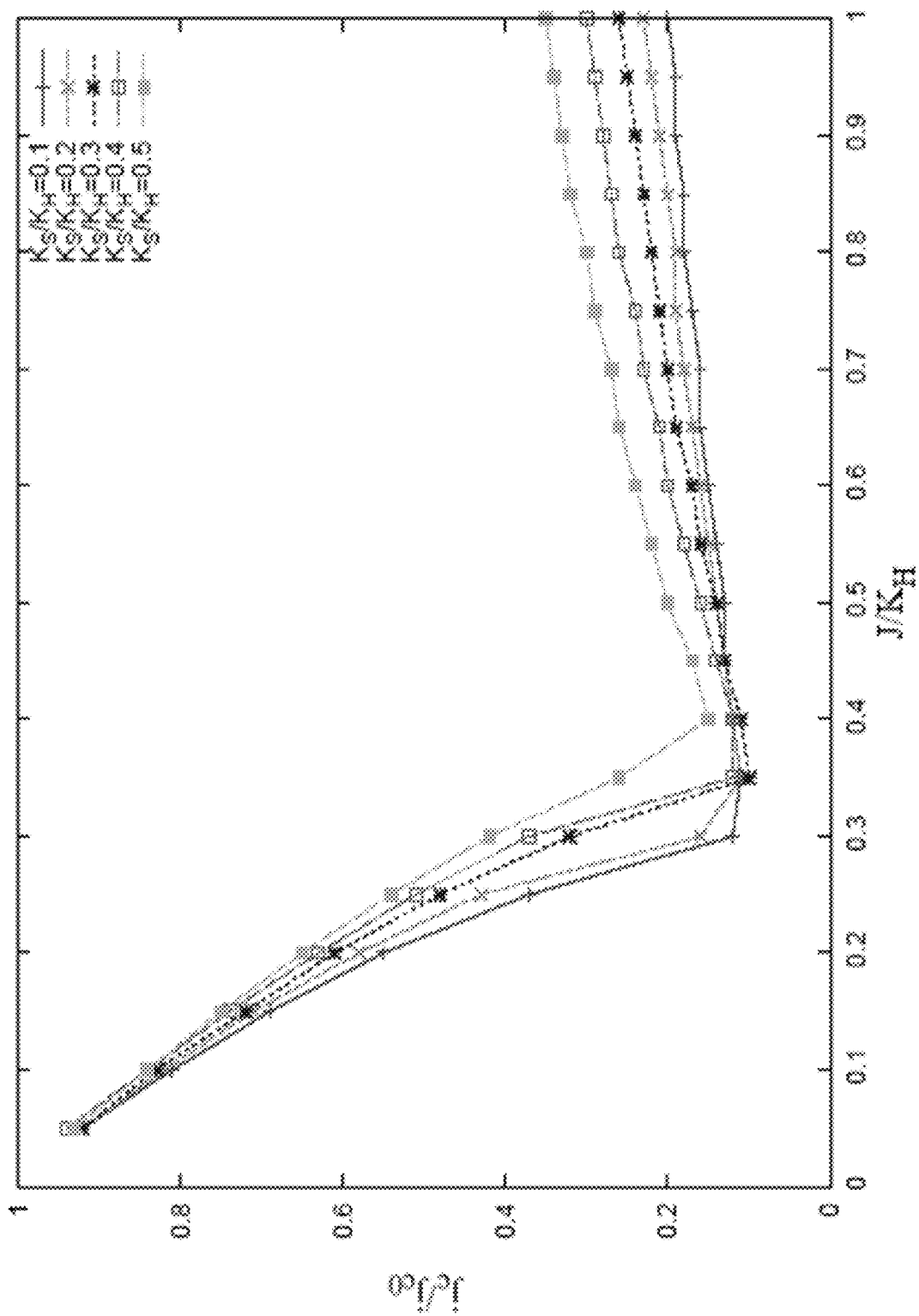
FIG. 8 is a graph diagram illustrating the effect of soft-layer anisotropy with respect to switching current, according to one embodiment.

FIG. 8 is a graph diagram illustrating the effect of soft-layer anisotropy with respect to switching current, according to one embodiment. In FIG. 8, the switching current $j_c$, normalized by $j_{co}$ (which is the switching current when no assisting layer 4 is used), is plotted against the exchange coupling J, which is normalized by $K_H$ (anisotropy of the hard recording layer 6). FIG. 8 shows various example curves associated with varying anisotropy ratios between a soft layer (e.g., assisting layer 4) and a hard layer (e.g., recording layer 6), indicated by the ratio $K_S/K_H$. ($K_H$ is the anisotropy of the hard recording layer 6, and $K_S$ is the anisotropy of the soft assisting layer 4.) In some cases, the anisotropy of the soft layer may be somewhat hard to control. However, as shown in FIG. 8, slight variances in this anisotropy of the soft layer may not have much overall effect on the switching current $j_c$, given that the various curves shown in FIG. 8 show similar characteristics for varying levels of anisotropy for the soft layer (with respect to the hard layer). As a result, the switching current $j_c$ may still be reduced, or minimized, for various different anisotropies of the soft layer that are lower than the anisotropy of the hard (recording) layer.

Figure 9:
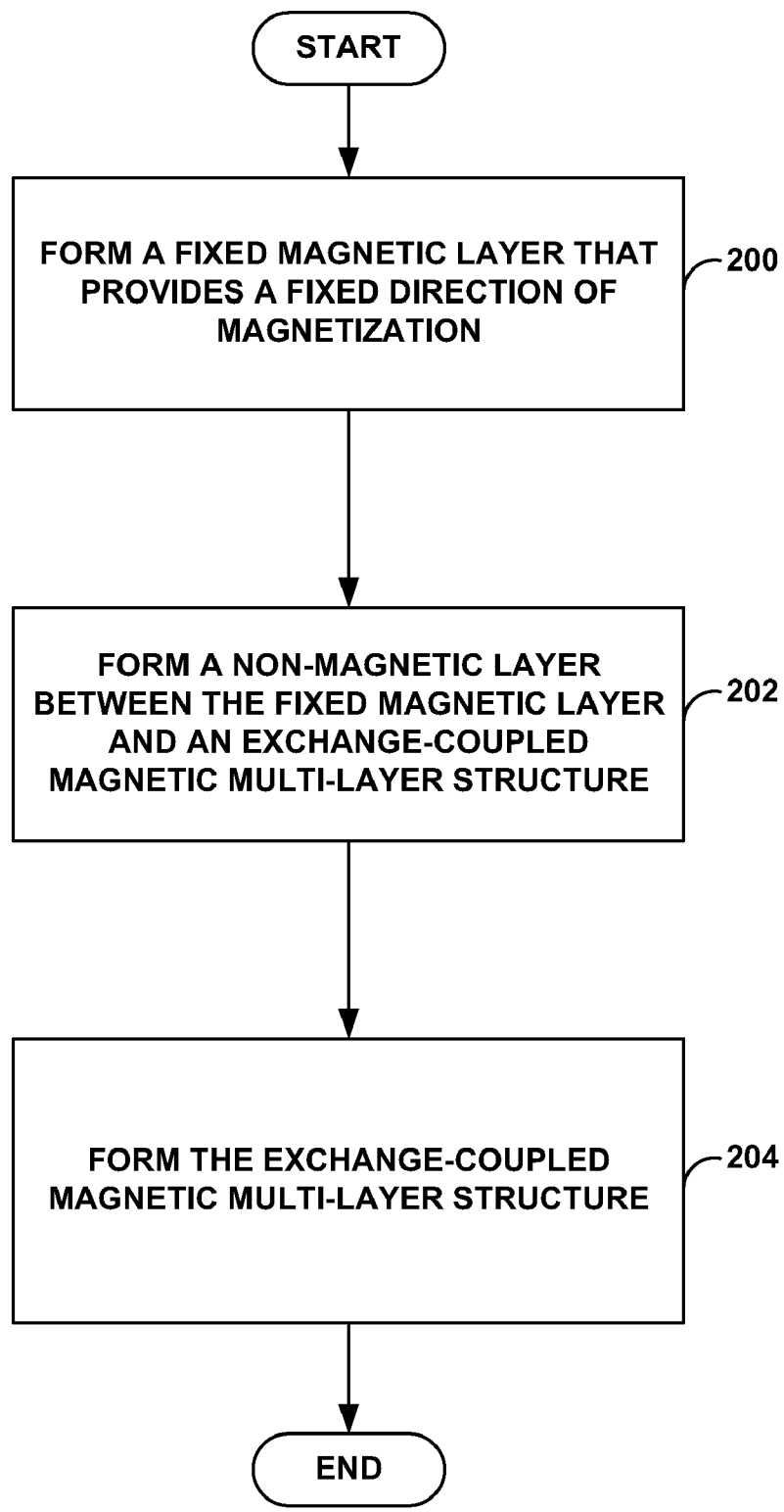
FIG. 9 is a flow diagram illustrating a method for forming, or manufacturing, a component of a magnetic memory device, according to one embodiment.

FIG. 9 is a flow diagram illustrating a method for forming, or manufacturing, a component of a magnetic memory device, such as an MRAM cell, according to one embodiment. In this embodiment, a fixed magnetic layer (e.g., fixed layer 1 shown in FIG. 1) may be formed, where the fixed magnetic layer provides a fixed direction of magnetization (200). A non-magnetic layer (e.g., non-magnetic layer 3) may be formed (202). An exchange-coupled magnetic multi-layer structure (e.g., multi-layer structure 2) may also be formed (204). The non-magnetic layer may be formed between the fixed magnetic layer and the exchange-coupled magnetic multi-layer structure. The fixed magnetic layer may comprise a spin polarizer.

In some cases, the fixed magnetic layer, the exchange-coupled magnetic multi-layer structure, and the non-magnetic layer comprise an MRAM memory cell. The method shown in FIG. 9 may further comprise forming a plurality of bit lines (e.g., bit lines 50A, 50B shown in FIG. 4), forming a plurality of word lines (e.g., word lines 60A, 60B), forming a first electrical contact (e.g., electrical contact 14 shown in FIG. 2) between the fixed magnetic layer of the memory cell and one of the bit lines, and forming a second electrical contact (e.g., electrical contact 12) between the recording layer within the exchange-coupled magnetic multi-layer structure of the memory cell and one of the word lines.

In some cases, the method shown in FIG. 9 may further comprise forming a plurality of additional memory cells (which may include one or more MRAM memory cells), forming 2*a* first set of electrical contacts between the additional memory cells and the bit lines, and forming a second set of electrical contacts between the additional memory cells and the word lines. In some cases, the bit lines are formed orthogonal to the word lines.

Figure 10:
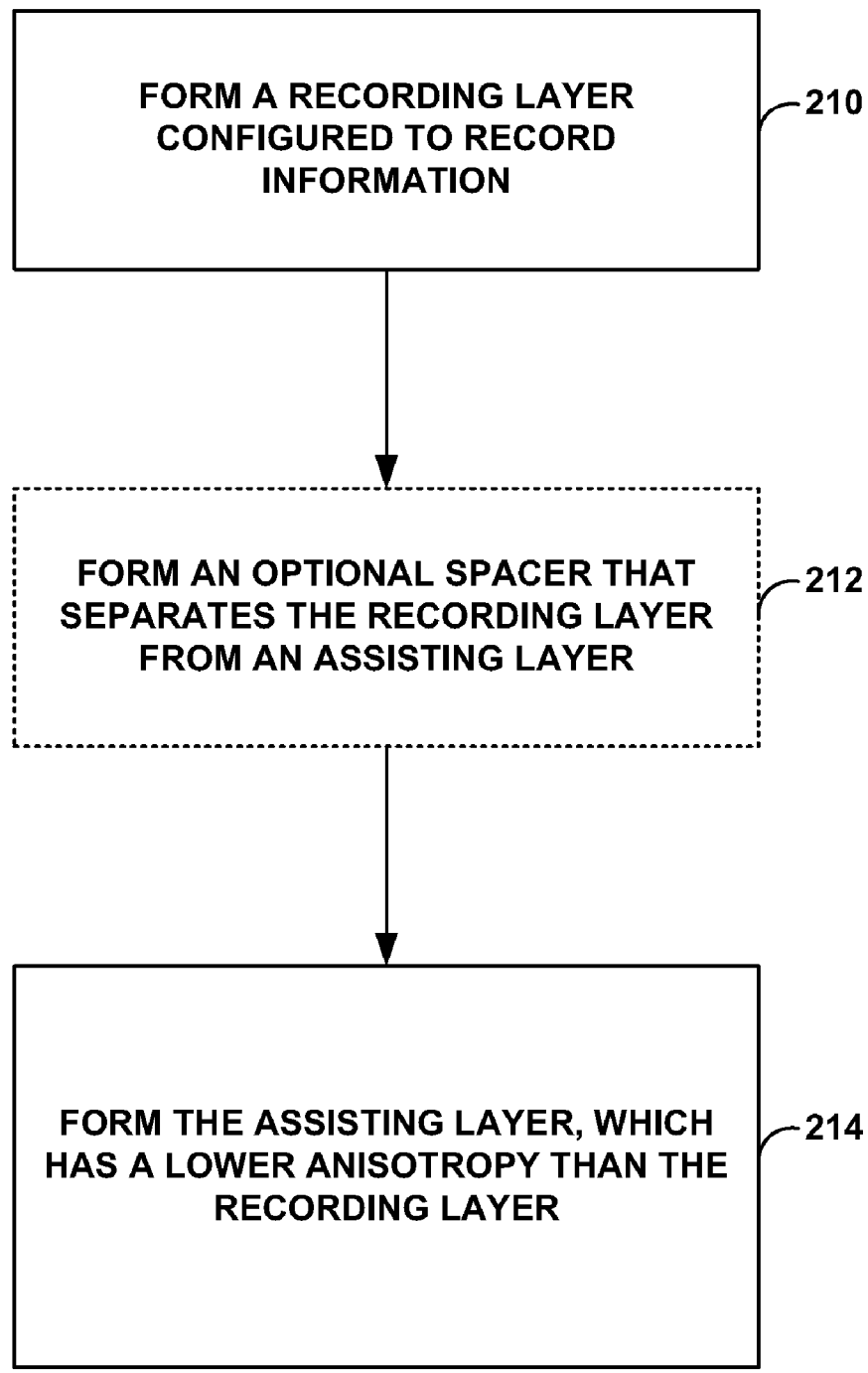
FIG. 10 is a flow diagram illustrating a method for forming, or manufacturing, an exchange-coupled magnetic multi-layer structure, according to one embodiment.

FIG. 10 is a flow diagram illustrating a method for forming, or manufacturing, an exchange-coupled magnetic multi-layer structure, such as multi-layer structure 2, according to one embodiment. In this embodiment, forming the exchange-coupled magnetic multi-layer structure comprises forming a recording layer (e.g., recording layer 6) configured to record information (210), and forming an assisting layer (e.g., assisting layer 4) having a lower anisotropy than the recording layer (214). In some cases, forming the exchange-coupled magnetic multi-layer structure may optionally further comprise forming a spacer (e.g., spacer 5) separating the recording layer from the assisting layer and configured to weaken an exchange coupling between the recording and assisting layers (212), wherein the exchange coupling between the recording and assisting layers is operable to switch a magnetization direction of the recording layer.

In some cases, a damping constant of the assisting layer is lower than a damping constant of the recording layer. Forming the spacer of the exchange-coupled magnetic multi-layer structure may comprise selecting the spacer such that the exchange coupling between the recording and assisting layers is based on a factor of an anisotropy of the recording layer. In some cases, selecting the spacer may comprise selecting the spacer such that the exchange coupling between the recording and assisting layers is substantially equal to one half of the anisotropy of the recording layer. In some cases, selecting the spacer may comprise selecting a material or thickness of the spacer such that the exchange coupling between the recording and assisting layers is based on the factor of the anisotropy of the recording layer. Selecting the material or thickness of the spacer may comprise selecting a paramagnetic material, such as, for example, palladium or platinum.

In some cases, forming the assisting layer of the exchange-coupled magnetic multi-layer structure may comprise forming multiple sub-layers. Forming the multiple sub-layers within the assisting layer may comprise forming the multiple sub-layers to have monotonically increasing anisotropies as they approach the recording layer, wherein each sub-layer is formed to have a lower anisotropy than the recording layer. At least one sub-layer within the assisting layer may, in some cases, have a damping constant that is lower than a damping constant of the recording layer. The assisting layer may comprise a magnetically softer material than the recording layer. In some cases, spacers may be placed between individual sub-layers.

The various components illustrated herein may be realized by any suitable combination of hardware and/or firmware. Although various components may be depicted as separate units or modules, all or several of these components may be integrated into combined units or modules within common hardware and/or firmware. Accordingly, the representation of features as components, units or modules is intended to highlight particular functional features for ease of illustration, and does not necessarily require realization of such features by separate hardware or firmware components. In some cases, various units may be implemented as programmable processes performed by one or more processors.

Although various embodiments above have been described with reference to MRAM, the scope of the invention is not so limited. For example, various embodiments of the invention may be implemented in other forms of magnetic storage devices, or devices that utilize spin transfer torque switching.

Various embodiments of the invention have been described. These and other embodiments are within the scope of the following claims.

The invention claimed is:

1. An apparatus comprising:
   a fixed magnetic layer that provides a fixed direction of magnetization;
   an exchange-coupled magnetic multi-layer structure; and
   a non-magnetic layer placed between the fixed magnetic layer and the exchange-coupled magnetic multi-layer structure,
   wherein the exchange-coupled magnetic multi-layer structure comprises:
   a recording layer configured to record information; and
   an assisting layer having a lower anisotropy than the recording layer,
   wherein the exchange coupling between the recording and assisting layers is operable to switch a magnetization direction of the recording layer.

2. The apparatus of claim 1, wherein the exchange-coupled magnetic multi-layer structure further comprises a spacer separating the recording and assisting layers and configured to weaken an exchange coupling between the recording and assisting layers.

3. The apparatus of claim 2, wherein the spacer is selected such that the exchange coupling between the recording and assisting layers is based on a factor of an anisotropy of the recording layer.

4. The apparatus of claim 3, wherein the spacer is selected such that the exchange coupling between the recording and assisting layers is substantially equal to one half of the anisotropy of the recording layer.

5. The apparatus of claim 3, wherein a material or thickness of the spacer is selected such that the exchange coupling between the recording and assisting layers is based on the factor of the anisotropy of the recording layer.

6. The apparatus of claim 5, wherein the spacer is made of a paramagnetic material.

7. The apparatus of claim 1, wherein the non-magnetic layer comprises a tunnel barrier.

8. The apparatus of claim 1, wherein a damping constant of the assisting layer is lower than a damping constant of the recording layer.

9. The apparatus of claim 1, wherein the assisting layer comprises multiple sub-layers.

10. The apparatus of claim 9, wherein the multiple sub-layers within the assisting layer have monotonically increasing anisotropies as they approach the recording layer, and wherein each sub-layer has a lower anisotropy than the recording layer.

11. The apparatus of claim 9, wherein at least one sub-layer within the assisting layer has a damping constant that is lower than a damping constant of the recording layer.

12. The apparatus of claim 1, wherein the assisting layer comprises a magnetically softer material than the recording layer.

13. The apparatus of claim 1, further comprising:
   a first electrical contact coupled to the fixed magnetic layer; and
   a second electrical contact coupled to the recording layer of the exchange-coupled magnetic multi-layer structure.

14. The apparatus of claim 1, wherein the apparatus comprises a Magnetoresistive Random Access Memory (MRAM) memory cell.

15. A magnetic memory device, comprising:
a plurality of bit lines;
a plurality of word lines; and
a plurality of memory cells that are each coupled to one of the bit lines and one of the word lines, wherein at least one memory cell comprises:
a fixed magnetic layer that provides a fixed direction of magnetization;
an exchange-coupled magnetic multi-layer structure; and
a non-magnetic layer placed between the fixed magnetic layer and the exchange-coupled magnetic multi-layer structure,
wherein the exchange-coupled magnetic multi-layer structure comprises a recording layer configured to record information and an assisting layer having a lower anisotropy than the recording layer, and
wherein the exchange coupling between the recording and assisting layers is operable to switch a magnetization direction of the recording layer.

16. The magnetic memory device of claim 15, wherein the magnetic memory device comprises a Magnetoresistive Random Access Memory (MRAM) memory device, and wherein the at least one memory cell comprises an MRAM memory cell.

17. The magnetic memory device of claim 15, wherein the bit lines are orthogonal to the word lines.

18. The magnetic memory device of claim 15, wherein the exchange-coupled magnetic multi-layer structure further comprises a spacer separating the recording and assisting layers and configured to weaken an exchange coupling between the recording and assisting layers.

19. The magnetic memory device of claim 15, wherein the spacer of the at least one memory cell is selected such that the exchange coupling between the recording and assisting layers is based on a factor of an anisotropy of the recording layer in the at least one memory cell.

20. The magnetic memory device of claim 19, wherein the spacer of the at least one memory cell is selected such that the exchange coupling between the recording and assisting layers is substantially equal to one half of the anisotropy of the recording layer in the at least one memory cell.

21. The magnetic memory device of claim 19, wherein a material or thickness of the spacer in the at least one memory cell is selected such that the exchange coupling between the recording and assisting layers is based on the factor of the anisotropy of the recording layer in the at least one memory cell.

22. The magnetic memory device of claim 21, wherein the spacer of the at least one memory cell is made of a paramagnetic material.

23. The magnetic memory device of claim 15, wherein a damping constant of the assisting layer of the at least one memory cell is lower than a damping constant of the recording layer in at least one memory cell.

24. The magnetic memory device of claim 15, wherein the non-magnetic layer comprises a tunnel barrier.

25. The magnetic memory device of claim 15, wherein the assisting layer of the at least one memory cell comprises multiple sub-layers.

26. The magnetic memory device of claim 25, wherein the multiple sub-layers within the assisting layer of the at least one memory cell have monotonically increasing anisotropies as they approach the recording layer, and wherein each sub-layer has a lower anisotropy than the recording layer in the at least one memory cell.

27. The magnetic memory device of claim 25, wherein at least one sub-layer within the assisting layer of the at least one memory cell has a damping constant that is lower than a damping constant of the recording layer in the at least one memory cell.

28. The magnetic memory device of claim 15, wherein the assisting layer of the at least one memory cell comprises a magnetically softer material than the recording layer of the at least one memory cell.

29. The magnetic memory device of claim 15, wherein the at least one memory cell further comprises:
a first electrical contact configured to couple the fixed magnetic layer to one of the bit lines; and
a second electrical contact configured to couple the recording layer of the exchange-coupled magnetic multi-layer structure to one of the word lines.

30. A method comprising:
forming a fixed magnetic layer that provides a fixed direction of magnetization;
forming a non-magnetic layer; and
forming an exchange-coupled magnetic multi-layer structure,
wherein the non-magnetic layer is between the fixed magnetic layer and the exchange-coupled magnetic multi-layer structure, and
wherein forming the exchange-coupled magnetic multi-layer structure comprises:
forming a recording layer configured to record information; and
forming an assisting layer having a lower anisotropy than the recording layer,
wherein the exchange coupling between the recording and assisting layers is operable to switch a magnetization direction of the recording layer.

31. The method of claim 30, wherein the fixed magnetic layer, the exchange-coupled magnetic multi-layer structure, and the non-magnetic layer comprise a Magnetoresistive Random Access Memory (MRAM) memory cell, and wherein the method further comprises:
forming a plurality of bit lines;
forming a plurality of word lines;
forming a first electrical contact between the fixed magnetic layer of the memory cell and one of the bit lines; and
forming a second electrical contact between the recording layer within the exchange-coupled magnetic multi-layer structure of the memory cell and one of the word lines.

32. The method of claim 31, further comprising:
forming a plurality of additional memory cells;
forming a first set of electrical contacts between the additional memory cells and the bit lines; and
forming a second set of electrical contacts between the additional memory cells and the word lines.

33. The method of claim 31, wherein the bit lines are formed orthogonal to the word lines.

34. The method of claim 30, wherein forming the exchange-coupled magnetic multi-layer structure further comprises forming a spacer separating the recording layer from the assisting layer and configured to weaken an exchange coupling between the recording and assisting layers.

35. The method of claim 30, wherein forming the spacer of the exchange-coupled magnetic multi-layer structure comprises selecting the spacer such that the exchange coupling between the recording and assisting layers is based on a factor of an anisotropy of the recording layer.

36. The method of claim 35, wherein selecting the spacer comprises selecting the spacer such that the exchange coupling between the recording and assisting layers is substantially equal to one half of the anisotropy of the recording layer.

37. The method of claim 35, wherein selecting the spacer comprises selecting a material or thickness of the spacer such that the exchange coupling between the recording and assisting layers is based on the factor of the anisotropy of the recording layer.

38. The method of claim 37, wherein selecting the material or thickness of the spacer comprises selecting a paramagnetic material.

39. The method of claim 30, wherein a damping constant of the assisting layer is lower than a damping constant of the recording layer.

40. The method of claim 30, wherein forming the non-magnetic layer comprises forming a tunnel barrier.

41. The method of claim 30, wherein forming the assisting layer of the exchange-coupled magnetic multi-layer structure comprises forming multiple sub-layers.

42. The method of claim 41, wherein forming the multiple sub-layers within the assisting layer comprises forming the multiple sub-layers to have monotonically increasing anisotropies as they approach the recording layer, and wherein each sub-layer is formed to have a lower anisotropy than the recording layer.

43. The method of claim 41, wherein at least one sub-layer within the assisting layer has a damping constant that is lower than a damping constant of the recording layer.

44. The method of claim 30, wherein the assisting layer comprises a magnetically softer material than the recording layer.

* * * * *

UNITED STATES PATENT AND TRADEMARK OFFICE
CERTIFICATE OF CORRECTION

PATENT NO. : 8,134,864 B2
APPLICATION NO. : 12/541111
DATED : March 13, 2012
INVENTOR(S) : Randall H. Victora et al.

Page 1 of 1

It is certified that error appears in the above-identified patent and that said Letters Patent is hereby corrected as shown below:

In the Specification

Column 1, line 15: "may have certain rights" should be changed to --has certain rights--.

Signed and Sealed this
Seventh Day of October, 2014

Michelle K. Lee
*Deputy Director of the United States Patent and Trademark Office*